United States Patent [19]

Cox et al.

[11] Patent Number: 4,939,389

[45] Date of Patent: Jul. 3, 1990

[54] VLSI PERFORMANCE COMPENSATION FOR OFF-CHIP DRIVERS AND CLOCK GENERATION

[75] Inventors: Dennis T. Cox; David L. Guertin; Charles L. Johnson; Bruce G. Rudolph, all of Rochester, Minn.; Mark E. Turner, Colchester, Vt.; Robert R. Williams, Rochester, Minn.

[73] Assignee: International Business Machines Corporation, Armonk, N.Y.

[21] Appl. No.: 240,853

[22] Filed: Sep. 2, 1988

[51] Int. Cl.⁵ .................. H03K 19/017; H03K 19/096
[52] U.S. Cl. .................................. 307/443; 307/452; 307/481; 307/269; 307/594; 371/15.1; 371/28; 377/34
[58] Field of Search ................ 371/15, 28, 19-20, 371/34, 55, 56; 324/73 R, 73 AT; 307/443, 448, 451-453, 465, 468, 469, 475, 480-481, 263, 269, 591-595, 601, 605, 606, 272.2, 296.5; 377/19-20, 34, 55, 56

[56] References Cited

U.S. PATENT DOCUMENTS

| | | |
|---|---|---|
| 4,383,216 | 5/1983 | Dorler et al. ................. 307/296.1 X |
| 4,473,762 | 9/1984 | Luzhashi et al. ............... 307/591 X |
| 4,494,021 | 1/1985 | Bell et al. ....................... 307/591 |
| 4,623,805 | 11/1986 | Flora et al. ..................... 307/591 X |
| 4,641,048 | 2/1987 | Pollock ........................... 307/591 |
| 4,684,897 | 8/1987 | Richards et al. ............... 307/591 X |
| 4,691,124 | 9/1987 | Ledzius et al. ................. 307/443 X |
| 4,815,113 | 3/1989 | Ludwig et al. ................. 307/263 X |
| 4,818,901 | 4/1989 | Young et al. ................... 307/263 X |

OTHER PUBLICATIONS

King et al, "Delay and Power Tolerance Regulator for FET Logic", *IBM TDB*, vol. 23, No. 4, 9-1980, pp. 1305-1306.

Kilmer, "Process-Independent Delay Driver", *IBM T.D.B.*, vol. 23, No. 9, 2-1981, pp. 4187-4188.

Primary Examiner—David Hudspeth
Attorney, Agent, or Firm—J. Michael Anglin

[57] ABSTRACT

A performance-sensing element (PSE) circuit detects the actual speed of other circuits on the same chip by launching a pulse into a tapped cascade of circuits on the chip, then detecting how far the pulse has progressed after a known interval. Control signals indicating circuit speed can stabilize parameters of the other circuits, such as rate of change of current (di/dt) in driver circuits, absolute delay of clock signals from one chip to another, and relative delay of multiple clock signals within the chip.

46 Claims, 9 Drawing Sheets

VLSI PERFORMANCE COMPENSATION FOR OFF-CHIP DRIVERS AND CLOCK GENERATION

BACKGROUND OF THE INVENTION

The present invention relates to solid-state integrated circuits, and more particularly concerns a circuit for sensing the speed of the circuits on a particular chip and the use of performance sensing for stabilizing the performance of circuits on the chip.

The performance characteristics of circuits in a digital integrated circuit vary with unavoidable changes in process parameters during their manufacture, with changes in their supply voltage, and with the temperature of their environment. Even within the same system, it is not uncommon for these "PVT" variations to vary the operating speed and the rate of current change (di/dt) over a very wide range from their nominal values. Logic circuits must therefore be specified for extreme worst-case conditions rather than nearer the nominal values.

Disadvantages accrue at both ends of the performance range. Off-chip driver circuits on a chip increase the power of signals on the chip and supply them to external package pins for transmission to another chip or to some other device. Operation of off-chip drivers greatly in excess of their nominal speed increases their di/dt enough to create excessive spikes on the supply-voltage and ground busses of the chip, which couples enough noise into the logic circuits and signal lines to produce faults in the signals on the chip.

Excessive speed can also cause "early mode" clock failures, resulting in the storing and transmission of false data in the signal lines. Many digital circuits use at least two different clock phases which must be nonoverlapping. For example, a conventional master/slave latch receives and stores the state of its data input at the leading and trailing edges respectively of a first clock pulse, and transmits and stores that data at its output at the rising and falling edges of a second clock pulse. If the clocks overlap, an early-arriving data input level can propagate through the master latch, and then be latched into the slave latch one cycle early.

At the other end of the time scale, a low speed in the chip circuits can cause "late mode" clock failures. In a multi-chip system, each clock line to the various chips are carefully routed on a circuit board or substrate so that the signal arrives at all chips as nearly simultaneously as possible, so that signals traveling from chip to chip can be processed and stored accurately. But PVT variations among the different chips of the system still skew the arrival of the clock signals at the circuits on each chip which process the signals. In conventional chips, this chip-to-chip skew limits the minimum cycle time which can be reliably obtained for the entire system.

Low speed also limits the overall speed of the off-chip drivers. Thus, limiting the di/dt to a safe value for fast circuits may greatly decrease the performance of the entire chip at low circuit speeds.

Of course, tightening the allowable limits of the manufacturing process parameters will reduce the severity of the above problems. Strict temperature control of the environment will also lessen their impact. Tight tolerances on supply voltages, achieved by greater supply regulation and by wider on-chip power-distribution busses, will further reduce the range between worst case and nominal operation, as will lower resistance and inductance of the chip package. Such brute-force solutions, however, are expensive and often conflict with other goals.

Other, less direct, techniques have been employed to reduce the problem of driver noise from excessive di/dt. "Self-Adjusting Stagger Circuit for Drivers," 28 IBM Technical Disclosure Bulletin 2178 (Oct. 1985) forces drivers in different groups to switch at slightly different times, to decrease total chip di/dt. A similar technique is used in "Method for Solving the Delta-I problem in One-Sided Crosspoint Switching Matrices," 28 IBM TDB 2248 (Oct. 1985). "Driver with Noise-Dependent Switching Speed Control," 29 IBM TDB 1243 (Aug. 1986), uses noise feedback to control the effective strength of a pulldown FET. This solution has some advantages, but it is requires special FETs with unusual characteristics, and it relies upon a ground reference that is affected by switching; U.S. Pat. No. 4,437,022 (Miersch, et al.) is similar. U.S. Pat. No. 4,725,747 (Stein, et al.) uses a serpentine polysilicon gate configuration to limit turn-on time; this technique cannot be implemented in some semiconductor technologies, and has other disadvantages as well. U.S. Pat. Nos. 4,398,106 (Davidson, et al.) and 4,508,981 (Dorler, et al.) are not applicable to off-chip drivers, and have diminished value when the chip itself has significant decoupling.

Commonly assigned patent application Ser. No. 110,399, filed on Oct. 20, 1987 for "Method for Digital Slope Control of Output Signals of Power Amplifiers in Semiconductor Circuits" (published by the European Pat. Office on Apr. 27, 1988 under No. 264,470) proposes the broad concept of measuring the performance of the circuits on a chip, and controlling the performance of an off-chip driver circuit in order to stabilize its di/dt within narrower limits over wide PVT variations. However, that compensation circuit depends upon a number of precision components which are expensive, require individual hand adjustment for every system of chips, and/or drift in value over time, temperature and voltage. The driver circuit of this patent requires an additional stage for control purposes, so that its maximum speed is less than drivers having fewer stages. Moreover, that driver has a state in which a signal line is not actively driven to a particular level, but is allowed to float. This allows the output line to be turned on erroneously by noise or undesired coupling to a nearby signal in the circuit. Finally, that patent does not even address the problem of clock skew, either for early-mode or late-mode faults. It thus suggests no way of employing performance sensing to solve those difficulties as well as to alleviate driver problems.

The most common previous solution to variable clock skew is to waste a portion of clock cycle so as to guarantee that the late-mode situation will not occur over the entire expected range of circuit speeds. Early-mode failures can be avoided by padding the circuits between latches with additional inverters. This, however, can use a significant portion of the chip's circuits—as many as 4,000 inverters in a single chip merely for speed compensation alone.

SUMMARY OF THE INVENTION

The present invention proposes a new circuit for sensing the performance of circuits on an integrated-circuit chip. This circuit is inexpensive to implement, requires only one external pin (plus another for testing the circuit) and one very inexpensive and inherently stable precision component.

The invention includes a driver circuit which is controlled by a performance sense element to stabilize its speed and di/dt over a wide range of PVT variations, both static and dynamic. The driver has only two stages, and has no internal lines which float at any time. It is fast, inexpensive, and can have multiple modes of compensation for PVT variations.

The invention further employs a performance sense element to reduce clock skew, both for a single clock among multiple chips in a system, and for multiple related clocks on the same chip. These functions also are simple and inexpensive to implement.

In a first aspect, a performance sense element controls a clock tree on each of a number of different chips to reduce variations in the total time interval between the arrival of the clock at the chip inputs and its arrival at the logic circuits in the different chips.

In another aspect, a performance sense element controls one clock tree on a chip differently from another clock tree on the same chip, in order to reduce the effects of skew between the two clock signals.

Briefly, the invention includes an integrated-circuit chip having a performance sense element which receives a pulse signal having a known interval and a strobe clock signal having a predetermined relation to the pulse. The pulse signal propagates down a cascade of circuit elements on the chip, and a storage connected to various points in the cascade holds an indication of the position of the pulse in the cascade at a time signalled by the strobe clock. The performance indication controls other circuits on the same chip.

One application of a performance sense element (PSE) is to stabilize the rate of change of output current in a driver circuit. A particularly advantageous driver for this purpose has a function circuit or predriver for receiving one or more input signals, an output circuit for powering the input to one of a number of higher current levels, and a control circuit for selecting among these levels in response to the performance indication of the PSE.

An application of a PSE in multiple chips of a system of integrated circuits is to receive the same system clock signal on different chips, to delay this signal by one of a number of different time intervals in response to the performance indication from the PSE, and to distribute the delayed clock signal to other circuits on the same chip.

An application of a PSE within a single chip of such a system is to receive multiple clock signals from outside the chip and to delay one of the clocks with respect to another clock, in response to the performance indication, and then to distribute the clocks to other circuits in the same chip.

Other objects and advantages, as well as modifications within the scope of the present invention, will appear in the following description of a preferred embodiment.

DESCRIPTION OF PREFERRED EMBODIMENT

Figure 1:
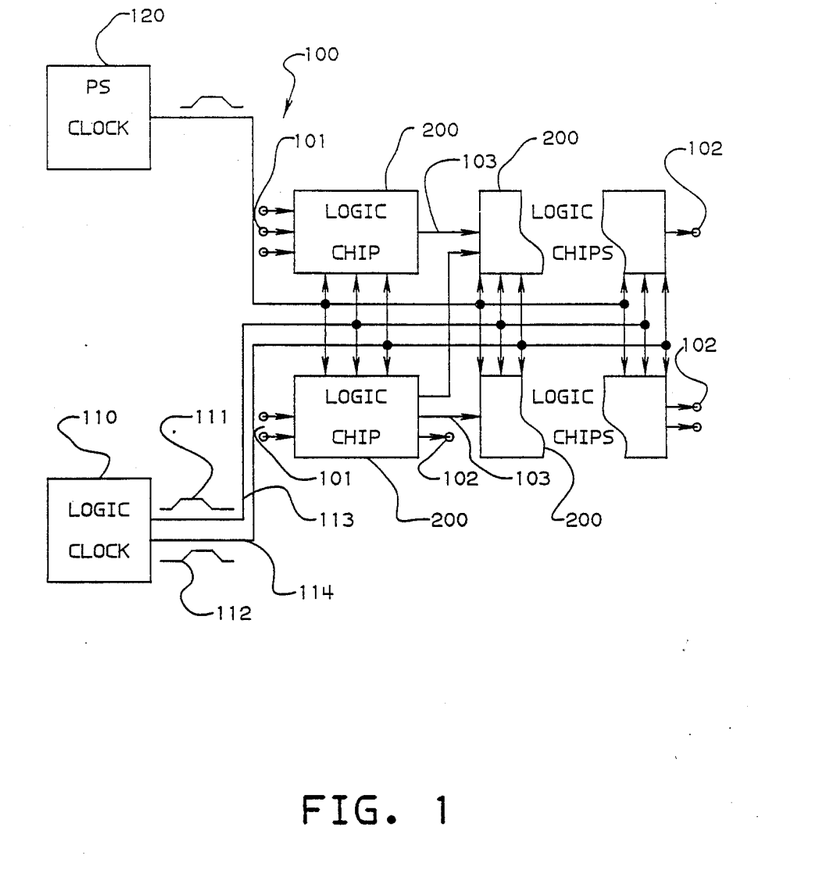
FIG. 1 illustrates a system of multiple logic chips which may be an environment of the present invention.

FIG. 1 shows a system 100 of integrated-circuit chips for performing one or more logic functions, such as might be used in an electronic data processor. A number of individual chips 200 receive signals at inputs such as 101, produce signals at outputs such as 102, and communicate with each other via signals on intermediate wiring such as 103.

A conventional clock generator 110 produces clock signals such as 111 and 112 on lines 113 and 114 respectively. Frequently, the high portions of the two clock signals must not overlap, as described below. The clocks are commonly input to all chips 200 for synchronizing the operation of latches and other circuits on the chips. Another clock generator, 120, is unique to the present invention. Generator 120 is a conventional oscillator for producing a pulse signal 121 having a precise and stable cycle time. In the context of the present embodiment, this signal may be a 20.48 MHz square wave, with an accuracy of better than 1% or so. Packaged crystal oscillators of 0.05% accuracy and excellent stability are easily obtainable and very inexpensive.

Figure 2:
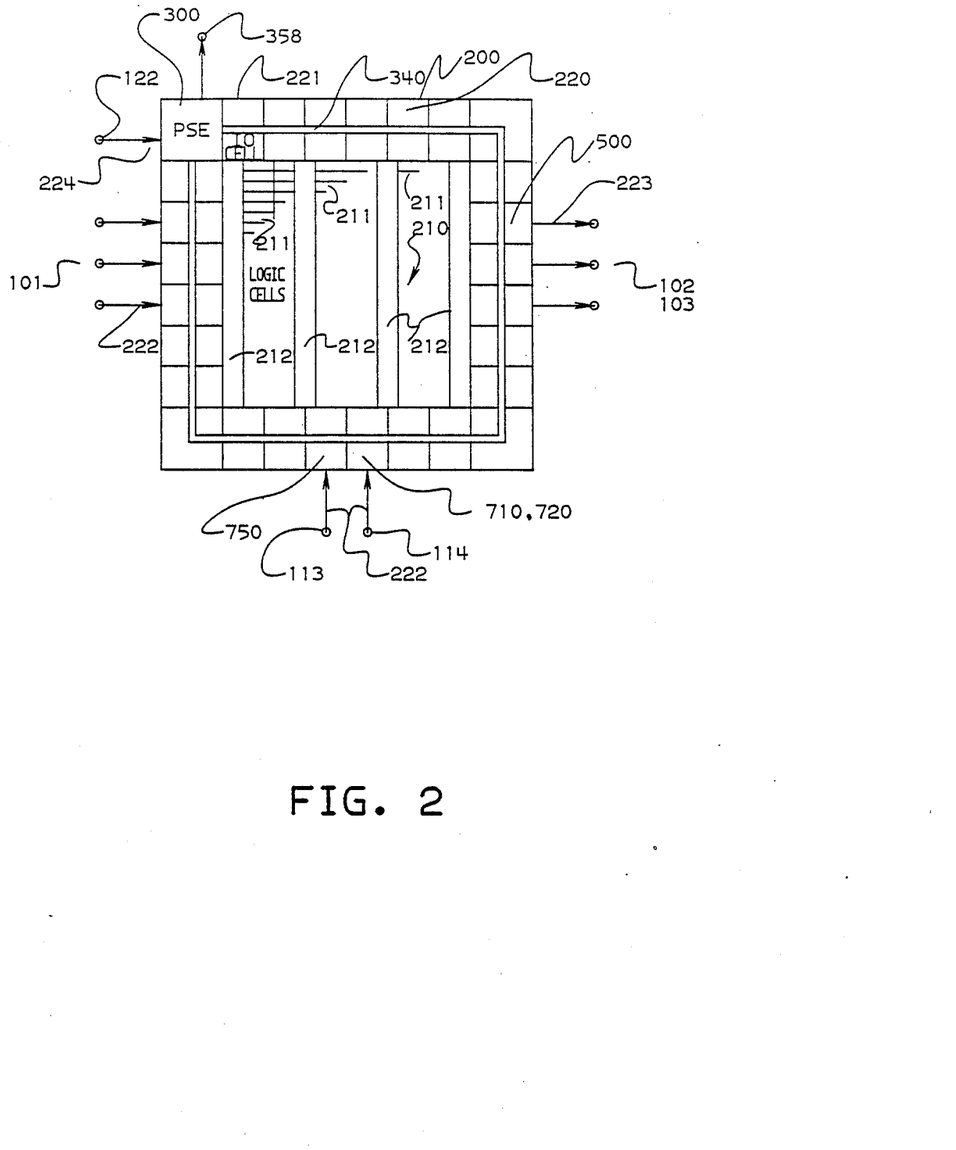
FIG. 2 shows an integrated-circuit chip in which the invention may be implemented.

FIG. 2 shows the layout of a chip 200 which incorporates the invention. The interior region 210 contains columns of conventional logic cells 211 separated by wiring bays 212. Bays 212 and wiring layers above the cells 211 contain personalized wiring for interconnecting the cells 211 and for connecting them to input/output (I/0) cells 221 in a peripheral region 220 of the chip. These cells contain conventional receiver circuits for receiving signals such as 101, 113 and 114 at pins 222, and also contain driver circuits for amplifying output signals appearing at off-chip pins 223. These amplified output signals then travel over lines 102 and 103 to other chips and to other systems.

An area occupying four I/0 cells 221 in the peripheral area 220 contains a performance sense element (PSE) 300. The circuits of this element receive the PS Clock pulse signal on line 122 at a dedicated off-chip pin 224. The PSE uses this signal to determine the speed of the circuits on its own chip 200, and to produce signals indicating this speed on a number of control lines 340. Since the circuits of PSE 300 are made at the same time as the other circuits on the chip, all process variations will affect the PSE circuits in the same way as the other circuits 211 and 221 on the same chip; and dynamic voltage and temperature variations will affect the PSE circuits in the same way as all other circuits on that chip. Control lines 340 overlie all I/O cells 221 for direct communication with every off-chip driver circuit on chip 200.

Figure 3:
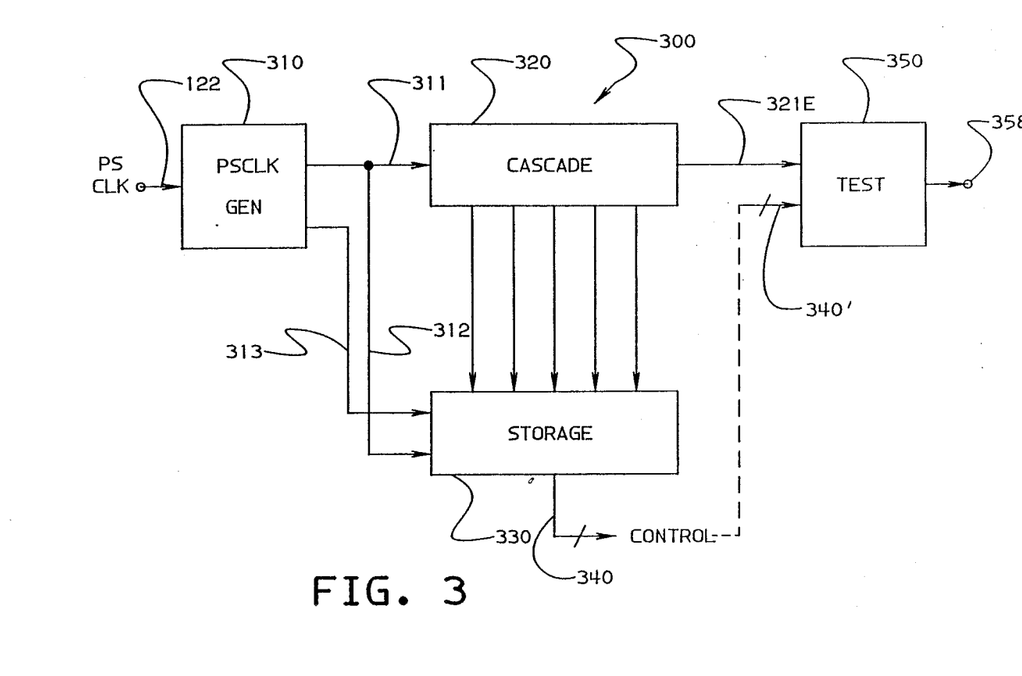
FIG. 3 is a high-level block diagram of an improved performance sense element (PSE) according to the invention.

FIG. 3 shows the major units of the performance sense element 300 according to the invention. PS Clock generator 310 uses the precise-frequency PS Clock signal 122 to derive a pulse signal 311 having a known pulse interval, and to derive a set of strobe clock signals 312 and 313, at least one of which has a known time relationship to the pulse signal 311. In this implementation, signal 312 is the same as the trailing edge of the pulse of signal 311; however, these two signals could have a different time relationship to each other if desired. Moreover, line 311 could be some other means for receiving a pulse signal, either from another circuit on chip 200 or from off the chip in system 100; lines 312 and 313 could likewise comprise some other means for receiving a local or remote strobe signal.

Cascade unit 320 is a group of circuits (or a single circuit) similar to other logic circuits in the same chip. Therefore, the characteristics of these circuits will vary in the same way with process variations and operating conditions (such as temperature) as these other circuits vary. Cascade unit 320 produces signals on lines 321 which depend upon variations in the speed of the chip circuits. Storage unit 330 latches or otherwise stores the values of signals 321, and outputs related control signals on control means 340, a bus of wires.

A circuit such as 300 is difficult to test adequately. Block 350 is a test circuit which receives a cascade output 321E, the control bus as it reenters the PSE cell after circling the chip 200, as shown at 340'. Applying test signals at the PS clock input and at the test input 356 produces a known response at the test output 359 if the PSE is working correctly.

Figure 4:
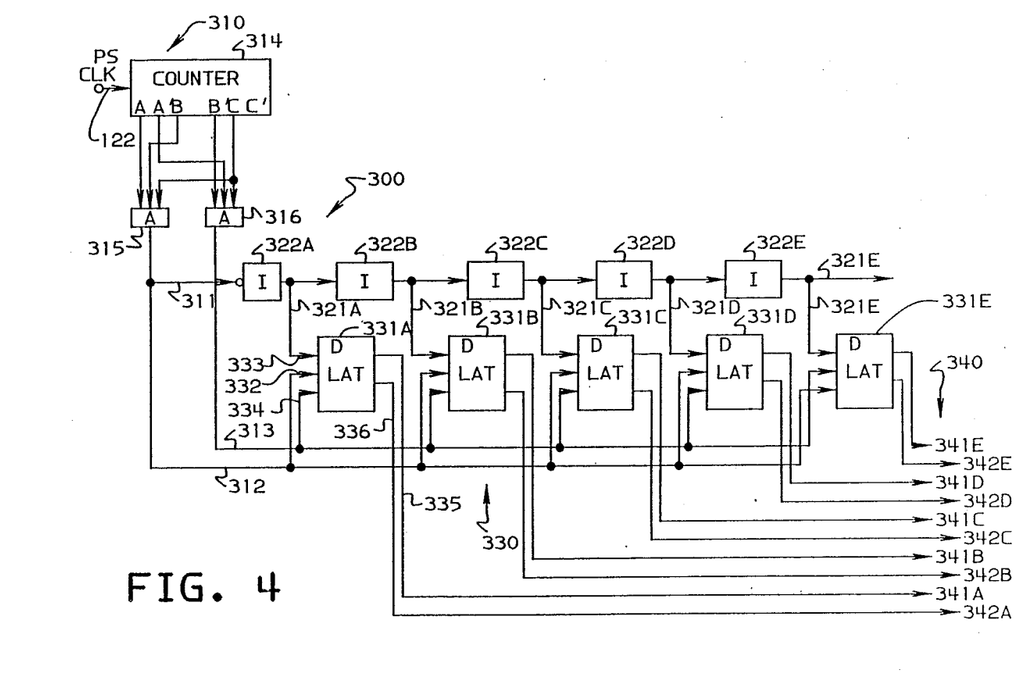
FIG. 4 is a detailed circuit diagram of the PSE of FIG. 3.

FIG. 4 details the circuits of the PSE 300. A three-stage counter 314 receives the 20.48 MHz PS Clock 122. (This unit is required because the PSE requires a pulse of precise duration; although the overall cycle time of PS clock 120 is very precise, its pulse width or duty cycle is typically not well controlled.) Counter 314 is a conventional Gray-code counter, in which one and only one output changes at an edge of each clock pulse. The sequence of the three stage outputs 314A, B, and C is:

| Count: | 0 | 1 | 2 | 3 | 4 | 5 | 6 | 7 |
| --- | --- | --- | --- | --- | --- | --- | --- | --- |
| 314A: | 0 | 1 | 1 | 0 | 0 | 1 | 1 | 0 |
| 314B: | 0 | 0 | 1 | 1 | 1 | 1 | 0 | 0 |
| 314C: | 0 | 0 | 0 | 0 | 1 | 1 | 1 | 1 |

Each stage also has complementary output 311A', B', and C'. AND gate 315 thus produces a pulse on lines 311 and 312 at count #5 (111) of a cycle of eight PS Clock pulses, while AND 316 produces a pulse on line 313 at count #7 (001). This choice, and the impossibility of glitches in a Gray code, guarantees that signals 312 and 313 will not overlap.

Cascade unit 320 comprises a chain of inverters 322. Inverters were chosen because they are the simplest and fastest circuits in a logic family, and thus provide the highest resolution for measuring the speed of the chip circuits. The first inverter group, 322A, provides a short delay and inverts the polarity of the pulse signal 311 at line 321A. Inverter group 322B inverts the signal twice, so that the polarity at line 321B is the same as at 321A. Inverter groups 322C-E provide further polarity-preserving delays at lines 321C-E. The number of inverters in each group 322A-E are actually 93, 22, 30, 36, and 46, so that the total units of delay at the lines 321A-E are 93, 115, 145 181, and 227. Any arbitrary function of delay versus tap could obviously be provided. In this embodiment, the resolution per pair of inverters is about 2%.

Storage unit 330 includes latches for storing the location of pulse signal 311 in cascade unit 320 at a known constant interval of time after its introduction into the cascade. Latches 331 are of the master/slave type, in which the falling edge of a clock pulse at clock input 332 stores the value of the signal at data input 333, and the falling edge of another clock input 334 transfers the value of that signal to an output line 335. An output line 36 carries the complement of the signal on output 35. Clock lines 312 and 313 have a propagation delay which is small relative to the delay through cascade unit 320, so that all of the latches 331A-E receive their clock signals substantially simultaneously.

If the chip 200 is very slow, the rising edge of pulse signal 311 will have propagated only part of the way through inverter 322A by the time the falling edge of the pulse reaches clock input 332 of latch 331A via line 312. In this case, all of the latches 331A-E store 1 values. If the process is somewhat faster, the rising edge will have propagated completely through inverters 322A, switching line 321A low, by the time the falling edge on line 312 reaches the clock inputs of the latches 331A-E. Progressively faster processes thus turn off more of the latches. The states of the latches are as follows:

| Speed: | slow | → | → | → | → | fast |
| --- | --- | --- | --- | --- | --- | --- |
| 1A: | 1 | 0 | 0 | 0 | 0 | 0 |
| 331B: | 1 | 1 | 0 | 0 | 0 | 0 |
| 331C: | 1 | 1 | 1 | 0 | 0 | 0 |
| 331D: | 1 | 1 | 1 | 1 | 0 | 0 |
| 331E: | 1 | 1 | 1 | 1 | 1 | 0 |

Bus 340 gathers the latch outputs into a set of control signals which can affect the operation of other circuits on chip 200, as shown in FIG. 2. Bus lines 341A-E are connected to the true outputs of latches 331A-E respectively, and carry the values of the latches after clock 313 has transferred the stored values to their output lines. Bus lines 342A-E couple to the complementary outputs of the latches. The control bus 340 could, if desired, encode the signals or modify them by some function.

Figure 4A:
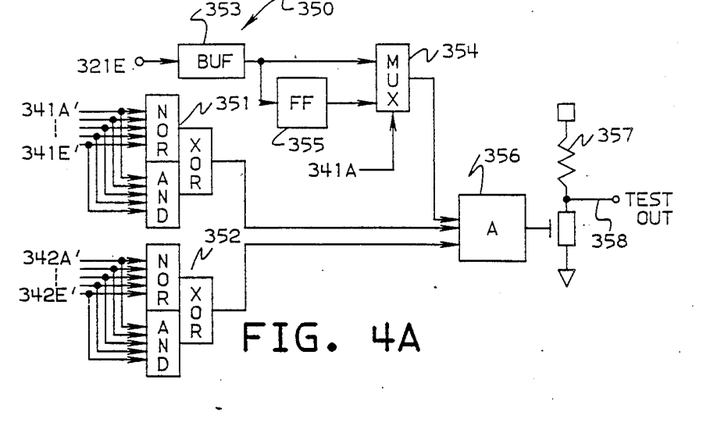
FIG. 4A is a diagram of a test circuit which may be used with the PSE of FIG. 4.

FIG. 4A shows a test circuit 350 for the PSE 300. A circuit such as 300 may be difficult to test properly using conventional techniques such as level-sensitive scan design (LSSD). The test circuit uses a layout of control bus 340 in which true and complement lines are interdigitated; that is, line 341A lies next to 342A, then 341B and 342B, and so forth. This guarantees that adjacent lines always carry opposite-level signals.

A comparator 351 receives control-bus lines 341A'-E' after they have circumnavigated the chip 200. In FIG. 2, lines 341A-E are those leaving the right side of the PSE cell, while lines 341A'-E' are those entering the bottom of the cell. A NOR gate goes high when none of the lines 341A'-E' is high, while an AND gate goes high only when all are high. An XOR produces a signal on line 1114 when one or the other of the gates is high, but not when both are high. Comparator 352 produces a similar signal at its output from the complementary control lines 342A'-E'

A buffer 353 receives final output 321E of the PSE cascade unit 320, and passes it directly to one input of a multiplexer or switch 354. The other input of multiplexer 354 is the same signal, but divided to one-half the frequency by a toggle flip-flop 355. The state of control signal 341A determines which of the two frequencies appears at the output of multiplexer 354. AND gate 356 receives the outputs of units 351, 352, and 354, and passes them to a simple driver circuit 357 coupled to an off-chip pin 358.

Applying a much lower than normal frequency to PS clock input 122, FIG. 4, guarantees that all control lines 341A-E should be low, and all complementary control lines 342A-E should be high. That is, the lower PS clock frequency tricks the PSE into believing that the chip circuits are very fast. The low level at 341A results in a signal at output 358 which pulses up and down at the rate of the pulses at 311, the output of the counter. Any other output indicates a fault in the PSE circuit. Subsequently applying a much higher than normal frequency to PS clock 122 switches all lines 341A-E high, and all lines 342A-E low. That is, the PSE now believes that the chip circuits are very slow, regardless of their actual speed within the allowable range. The high level on control line 341A now causes output pin 358 to pulsate at one half the rate of the pulses at 311. Any other output betrays a fault. This sequence tests for both high and low stuck faults and for adjacent lines shorted to each other in the control bus 340, as well as testing the circuits internal to the PSE itself.

Figures 5, 6:
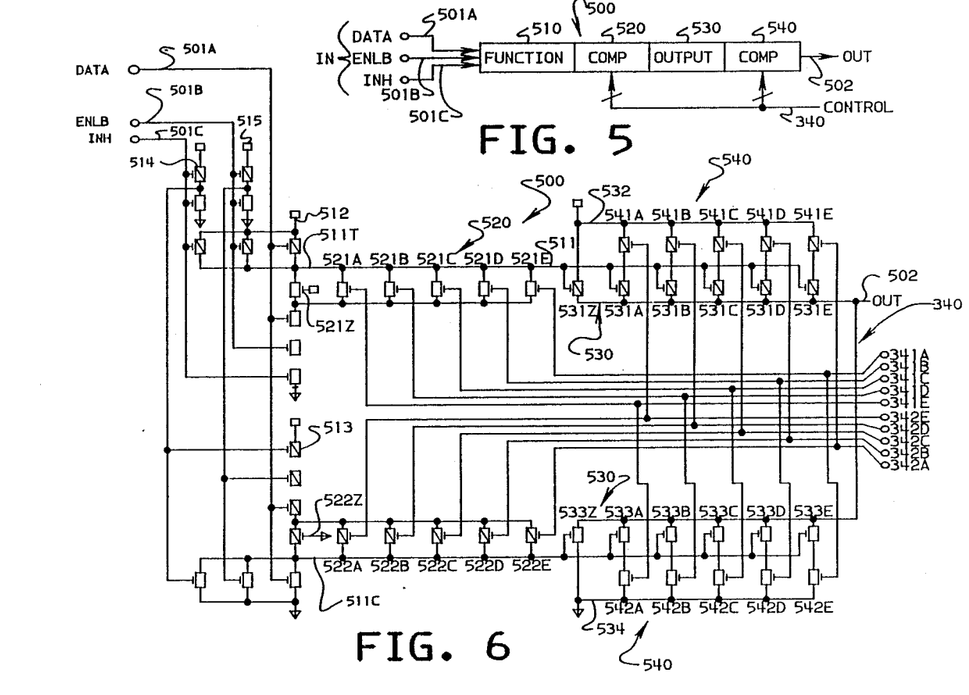
FIG. 5 is a block diagram of a driver circuit using on-chip performance sensing according to the invention.
FIG. 6 is a circuit diagram of the driver of FIG. 5.

FIG. 5 shows the major units of an off-chip I/0 driver 500 which can be controlled by PSE 300 to stabilize rate of current change (di/dt) in the off-chip drivers (OCDs) of chip 200 against variations in circuit speed, while still maintaining a specified switching speed. Since the OCDs consume much more current than the logic circuits 211, controlling the drivers adequately stabilizes the di/dt of the entire chip. An OCD circuit can be located in any of the I/O cells 221 of FIG. 2.

Input lines 501 carry signals 501A-C from various ones of the logic cells 211 of FIG. 2, and produce a higher-power output signal 502 at one of the chip pins 223, for transmission to another chip in the system 100 via wiring such as 103 in FIG. 1. The output 501 follows data input 501A as long as both the enable input 501B and the inhibit input 501C are high; otherwise, output 502 floats at an indeterminate level. A function or predriver circuit 510 performs this operation. A compensation circuit 520 receives the control bus 340 from the performance-sense element 300 of FIG. 3, and adjusts the performance of the function circuit in response to the parameters of the particular chip on which it its located. Intermediate signal 511 then drives an output circuit 530 to provide a higher-power version of signal 511 at the driver output 502. Another compensation circuit 540 adjusts the performance of the output circuit 530 in response to the performance signals on bus 340.

The purpose of the first compensation circuit, 520, is to stabilize the rate of change of voltage (dv/dt) in the predriver or function stage 510 as the circuit speed increases, so that the dv/dt of signal 511 remains substantially constant —that is, within significantly smaller bounds than the uncompensated signal The purpose of the second compensation circuit 540 is to stabilize —that is, to oppose the increase —in the di/dt of the output stage 530 as the circuit or process speed increases, so that the di/dt of the final output signal 502 remains substantially constant. In one version of the preferred embodiment, only a single compensation circuit is used. Some situations might make it advantageous to over- or under-compensate for process or environmental variations, so that the driver parameters would either increase or decrease with increasing circuit speed, possibly at rates different from that of the process, voltage, and temperature, or even at some more complex function of the circuit speed. Also, compensation of parameters other than dv/dt and di/dt might be advantageous in some instances.

FIG. 6 is an example of a driver circuit 500 in complementary metal-oxide semiconductor (CMOS) technology. N-channel field-effect transistors (NFETs) are shown as open rectangles, while P-channel FETs (PFETs) are shown with diagonal bars in the rectangles. Small squares represents connections to a positive supply voltage, and triangles represent ground connections. Driver 500 is built as two symmetrical halves, the polarities of the FETs in the lower half being inverted from those in the upper half. The upper half pulls output 502 high when input data signal 501A is high; the lower half pulls it low when the data input is low. When enable input 502B is low, or when inhibit input 502C is low, neither half conducts, allowing the output to float freely in a high-impedance state.

In the predriver stage 510, data input 501A connects directly to conventional AND trees 512 and 513. The enable and inhibit inputs couple to tree 512 directly, but to tree 513 via inverters 514 and 515. Thus, when Enable and Inhibit are both high, a high level at the Data input the series NFETs in tree 512 conduct and pull line 511T low; a low level at the Data input allows one of the parallel PFETs of this tree to conduct, pulling line 511T high. In the complementary tree 513, a high Data input allows one of the parallel NFETs to conduct, pulling line 511C low; a low level allows the series PFETs to pull it high. When either of the Enable or Inhibit lines is low, the paralleled PFETs of tree pull line 511T high, but the paralleled NFETs of tree 513 pull line 511C low.

Compensation circuit 521 includes six NFETs 521A-E, Z inserted in series with the upper input tree 512 and coupled in parallel with each other. These devices are sized considerably smaller than the other FETs in the tree, so that the compensation circuit effectively determines the performance of the entire tree. If, for example, the tree FETs are 75 microns wide by 0.5 microns long, then the compensation FETs might be 5 microns by 0.5 microns.

The gate of FET 521Z is connected directly to the positive supply, so it always conducts. The gates of the remaining FETs 521A-E connect to PSE control lines 341A-E respectively of control bus 340. All of these control lines carry 0s (i.e., a low level) when the chip circuits are very fast. In that situation, the one small FET 521Z throttles the series string of NFETs, so that its dv/dt cannot become extremely high when the process is fast, the supply voltage is high, or the chip is cold, as changes in the input signals 501 couple the string to ground. If the chip circuits are somewhat slower, PSE 300 turns on line 341A, causing FET 521A to conduct; this adds a parallel path to the tree 512, compensating for the otherwise slower dv/dt. Even lower overall circuit speeds progressively turn on more control lines, adding more compensation FETs in parallel to stabilize the switching speed of the signal on line 511T.

Compensation circuit also includes six PFETs 522A-E, Z in series with the lower input tree 513 and in parallel with each other. These FETs are also much smaller than the tree FETs. PFET 522Z always conducts, since its gate is tied permanently to ground. The gates of the other FETs 522A-E connect to PSE control lines 342A-E respectively of control bus 340. Thus, the single small FET 522Z throttles the series string of PFETs in the tree 513 when the overall circuit speed is high, but more compensation FETs 522A-E are added in parallel by control lines 342A-E as the overall speed becomes lower. Line 511C then switches at a substantially constant dv/dt as changes in the input signals 501 couple the string to the supply voltage.

Compensation circuit 520 does not control the dv/dt of tree 512 when it switches high (to the supply voltage), nor of tree 513 when it switches low (to ground). Under these circumstances, the corresponding output circuits switch very little current to or from the output line 502, so that compensation is unnecessary. In fact, it is desirable to switch off both trees very quickly when the driver is floated or tri-stated, so that no "shoot-through" path can be formed from the supply voltage directly to ground, should FETs 531 not yet have turned off when FETs 533 have already started to conduct, or vice versa. For other circuit technologies, however, it may be desirable to compensate in both directions. It may also be desirable to provide some function other than a full compensation. For example, if no compensation is used on the output circuit 530, increasing the predriver dv/dt with decreasing circuit speed provides some di/dt stabilization for the output 502.

Output circuit 530 increases the power of signals 511 to provide an output 502. Line 511T is high when data input 501A is low. Since this line couples to the bases of PFETs 531Z and 531A-E in parallel, they are all turned off, so that the positive supply voltage on line 532 is decoupled from output line 502. When the data input switches to a high state, line 511T switches low, turning on all the output FETs, pulling output 502 toward the positive supply voltage. However, only FET 531z is connected directly to the supply voltage on line 532; the remaining FETs 531A-E can conduct only as allowed by the second compensation circuit 540. The lower half of the output circuit 530 operates similarly. Line 511C is low when data input 501A is high, so that NFETs 533Z and 533A-E are all turned off, and the ground voltage on line 534 is decoupled from output line 502. When the data input switches to a low level, line 511T switches high, turning on all the output FETs, pulling output 502 toward ground. Again, only FET 533Z is connected directly to ground via line 534; the remaining FETs 533A-E can conduct only under the control of the second compensation circuit 540. In this manner, FETs 531 actively pull output 502 high for a high data input 501A, while FETs 533 actively pull it low for a low data input. When either of the Enable and Inhibit inputs 501B and C is low, neither set of FETs actively pulls the output; it is disconnected from both line 532 and line 534, and it floats to an indeterminate voltage in a high-impedance state.

Output compensation circuit circuit 540 determines how strongly the output circuit 530 can pull the output by regulating how much current can pass through the output circuit, and thus limits the di/dt on the output. It also provides a relatively constant output impedance, which is advantageous for matching purposes. If the overall chip circuits are very fast, all of the control lines 342A-E carry high levels, all the compensation PFETs 541A-E are turned off, and only the single output-circuit FET 531Z is available to couple supply voltage 532 to output line 502, since the compensation FETs are in series with the output FETs. The size of output FET 531Z, about 200 microns wide by 0.6 microns long, limits the current available to switch whatever capacities load may be on output line 502, and thereby limits the speed, di/dt, with which the output is able to react when switching to a high level. At a somewhat decreased overall circuit speed, PSE 300 lowers control line 342A, which turns on FET 541A and allows current to flow through output FET 531A, placing it in parallel with output FET 531Z. If the two series FETs 531A and 541A are both 43 microns wide, they will increase the current flow about 10% above the flow through 531Z alone. But, since the circuit speed is lower, and because compensator 520 has limited the dv/dt applied to the output FETs, the overall di/dt remains approximately the same. As PSE 300 lowers more and more of the control lines, more and more current becomes available. But again, the slower circuit speed which caused the PSE 300 to lower these lines constrains the di/dt to be bounded within a relatively narrow range when the driver switches to a high value 1 output on line 502.

Compensation FETs 542A-E in the lower half operate in a similar manner. At the highest circuit speed, all control lines 341A-E are at a low level, so output FET 533Z alone supplies current to switch the output line 502 towered ground. The lack of switching current limits the otherwise fast FET 533Z to a lower di/dt. Again, a somewhat decreased circuit speed causes PSE 300 to raise control line 431A, placing compensation FET 542A in parallel with FET 542Z. The increased current drive offsets the slower circuit speed to stabilize the output di/dt to approximately a constant value. Still slower speeds bring more of the compensation FETs into conduction, and thereby place more output FETs in parallel to increase switching current as a falling input signal brings output 502 toward ground. The compensation FETs need not all have the same size or characteristics. For example, FETs 541A-E and 542A-E could be made progressively larger, so that output current would increase faster than linearly with the number of control lines; or they could be made smaller, or in any other desired sequence of relative sizes.

Figure 7:
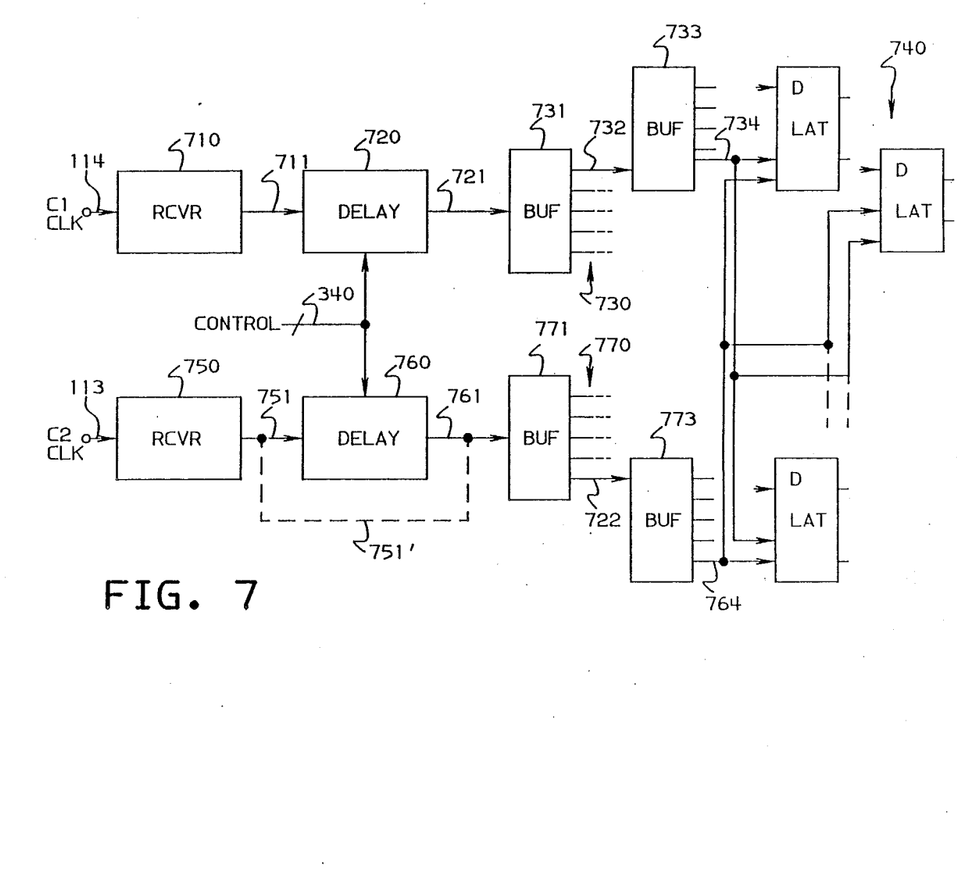
FIG. 7 shows the use of on-chip performance sensing for compensating clock-tree circuits on a chip.

FIG. 7 shows a portion 700 of the clock circuitry on a chip such as 200 in a logic system 100 of FIG. 1. Clock wiring such as 113 and 114 in system 100 is laid out by conventional methods (often by hand) to minimize skew in the arrival times of the clock signals 111 and 112 at the different chips 200 in the system. Nevertheless, differences in the internal circuit speed among the various chips 200 may still skew the arrival of the clock signals at the internal logic circuits 211 by an unacceptable amount.

A clock line such as 114 connects via an off-chip pin 222 to a conventional receiver circuit in an I/O cell 221. A delay circuit 720, preferably located in the same I/0 cell, accepts the clock signal on line 711 and produces a delayed version on line 721. The amount of the delay is determined by control bus 340, from performance sense element 300 in FIG. 3, or from any other type of means for sensing the speed of the circuits on the chip, as it may vary from one chip to another from process differences or environmental factors. A conventional clock tree 730, having multiple buffers such as 731 and 733, then distributes the compensated clock signal 721 to individual user circuits 740, such as conventional latches, on the chip.

Figure 8:
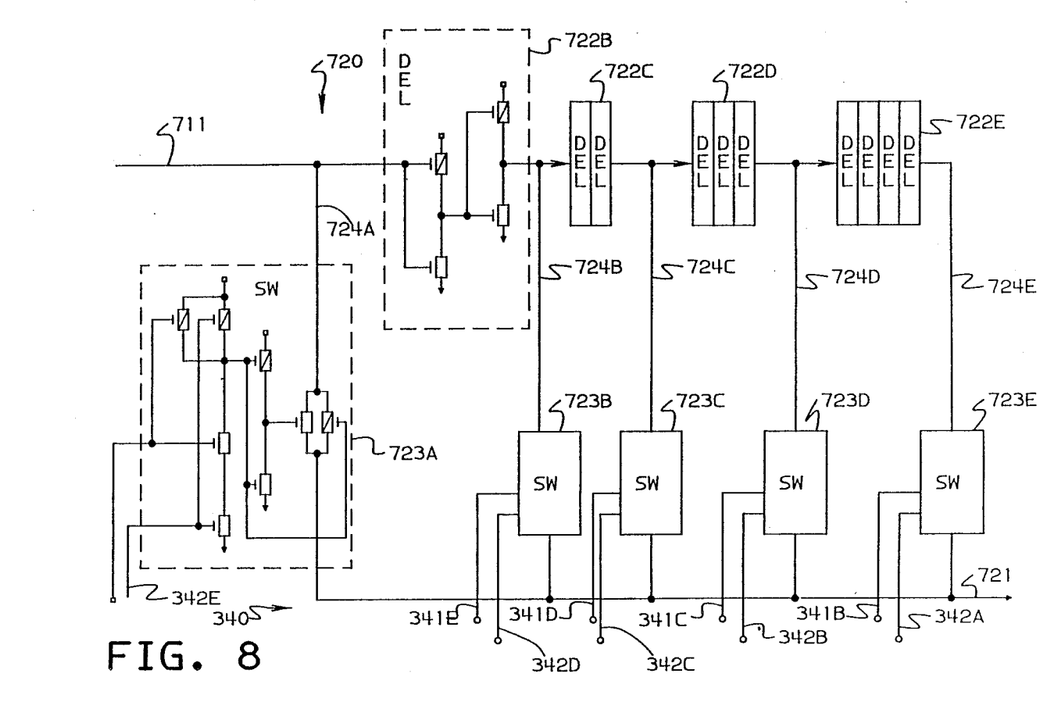
FIG. 8 is a circuit diagram of the delay element of FIG. 7.

FIG. 8 details the circuit of delay unit 720. The incoming clock signal 711 propagates down a chain of delay elements 722B-E. A number of switches 723A-E shunt the signal at one of a several points 724A-E along the chain to the output line 721, under the control of control bus 340 from the PSE 300.

The first pick-off point 724A occurs ahead of any delay element. (If receiver 710 does not include a circuit capable of driving the variable load of output 721, then delay circuit 720 should include a element ahead of the first pick-off point, to present a constant load to clock signal 114.) Switch 723A is a conventional CMOS circuit which provides a conductive path from its input at the top of the dashed box to its output at the bottom when both of the inputs at the left have a high or logic 1 level. (Input and output are interchangeable in this circuit.) Switch 723A is closed when control line 342A is high, since the other input of this switch is always activated by its connection to the supply voltage. Line 342A is high only when the chip circuits have a very low speed. Thus, the very small delay from input 711 to output 721 compensates for the low speed of the other circuits, 732, 740, etc., through which the signal passes.

The second tap 724B delays the clock signal by passing it through a CMOS two-inverter delay element 722B. This is the simplest and fastest circuit which does not change the input signal. Switch 723B connects the tap 724B to output line 721 only when PSE control line 342D is high and control line 341E is high. This latter condition occurs when its complement on 342E is low, so that switch 723A turns off when 723B turns on. Thus, the somewhat increased circuit speed results in a small amount of delay added to the clock signal before it reaches the clock distribution tree 730.

The third tap 724C delays the clock signal 711 with a total of three time units, by adding two sets of double inverters 722C to the single delay element 722B. Switch 723C connects this tap to output 712 when the circuit speed is faster yet; this is represented by lines 342C and 341D being high. Again, line 341D is high only when 342D is low, which turns off switch 723B.

Taps 724D and E operate similarly. The delays 722D and E include an increasing number of delay elements, because they are included in the signal path only as overall circuit speeds increase, so that the effective delay provided by a single delay element decreases. That is, the actual delay inserted in the signal path can be held approximately constant, even though a larger number of circuits is inserted at each step. This arrangement can of course be modified so that the amount of actual time delay between input 711 and output 721 is not constant; in fact, an arbitrary function of delay versus circuit speed is easily obtainable merely be changing the number and type of circuits in the delay elements.

FIGS. 7 and 8 as thus far described manage the problem of different delays from chip to chip in a multi-chip system such as 100 of FIG. 1. The problem of skew between two different clocks on a single chip can also be ameliorated with a PSE. Another clock signal 113, as shown in FIGS. 1, 2, and 7, also enters each chip in the system 100. This clock is commonly used by the same circuits 740 which use clock 114, and these circuits require that the two clock signals have a specified time relationship to each other. Commonly, they are required to be non-overlapping. If they should overlap, especially at high circuit speeds, a conventional master/slave latch such as those shown at 740 in FIG. 7 may send incorrect data from their inputs to their outputs.

The second clock signal on line 113 is accepted at an off-chip pin into receiver 750, which is located in another I/O cell 221. Receiver 750 may be constructed identically to receiver 710. For a system having only a single chip which receives the second clock, inter-chip skew is not a problem; in that case, connection 751' could send it directly to a second clock tree 760, without the intervention of a performance-related delay means. Buffer 771 and 773 of a second clock tree 770 provide a repowered second clock to some of the chip circuits 740 via line 764.

In most cases, however, the second clock does connect to multiple chips 200 in the system 100, so that inter-chip skew is a problem for that clock also. In those cases, line 751 connects a delay element 760 between the receiver 750 and the clock tree 770. Delay circuit may be identical to circuit 720. To use the total cycle time more effectively, the second clock may be allowed to overlap the first—or at least to approach overlap more closely -when overall circuit speed is low. Therefore, the amount of delay at each stage of circuit 760 can be made slightly smaller than the delay of the corresponding stages of delay 720. Again, delay 760 may use other functions of delay versus circuit speed, and the function used in delay 760 may differ from that in delay 720.

For simplicity, the clock circuits of FIGS. 7 and 8 use the same relatively low number of control lines in bus 340 as the number used by the driver of FIGS. 5 and 6. In some applications, however, it may be worth some increased complexity to add more control lines in order to regulate clock skew to a few percent, even though driver di/dt need only be stabilized to 30% or so. This tighter stabilization can be achieved merely by adding more stages to the PSE.

Although the foregoing description has concentrated upon the compensation of clock trees by adding a controllable delay, other types of circuit may also benefit from the use of a delay controllable according to the actual speed of the circuits on the same chip. For example, a PSE can allow even more drivers on a chip by adding the conventional approach of bank switching discussed above. The interval between the times the drivers in different banks are allowed to switch can be set by a delay element such as 720. As another example, circuits for addressing dynamic memories (DRAMs) frequently employ small delays among their various input signals.

Figure 9:
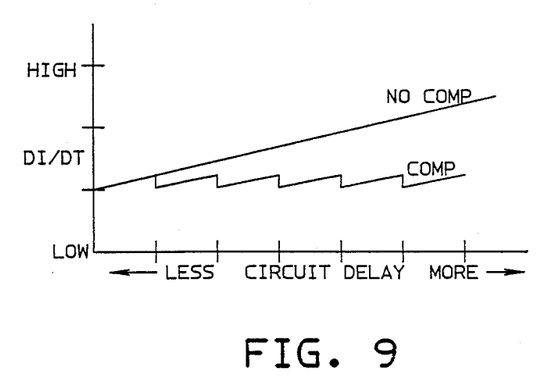
FIG. 9 is a graph illustrating the compensation of a driver circuit by on-chip performance sensing.

FIG. 9 is a graph which illustrates qualitatively the performance of driver circuit 500 of FIG. 5. The horizontal axis indicates the delay (i.e., the inverse of speed) of the circuits on chip 200, in arbitrary units. The vertical axis is di/dt, the relative rate of current change when driver 500 switches. The upper curve, labeled "NO COMP," shows the wide variation in di/dt over the allowable range of circuit speeds. Since di/dt varies as the square of circuit speed, a commonly encountered variation of 50% in circuit speed can increase di/dt by almost 250%. The lower curve, labeled "COMP," shows the effect of compensation circuits 520 and 540. These circuits can hold the total di/dt variation to under 30% over the entire allowable speed range by switching additional compensation into the driver circuit as the speed of the circuits on the chip increases. A variation of 30% is acceptable in most cases. Tighter control can be achieved by adding more control lines to the control bus 340. Also, although the overall envelope of the COMP curve is horizontal in FIG. 9, it may be made to ascend, descend, or follow some other function desired for a particular purpose.

Figure 10:
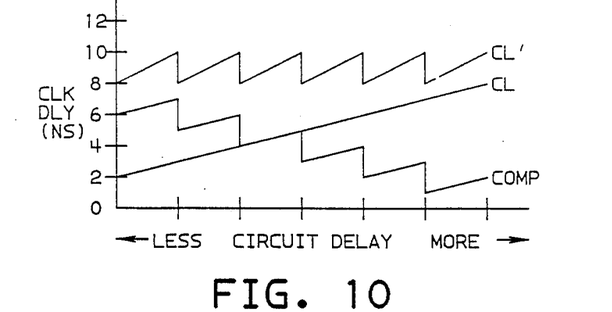
FIG. 10 is a graph showing delay compensation of a clock tree according to the invention.

FIG. 10 shows the compensation of a single clock C1 for delays from one chip to another to reduce late-mode problems. The horizontal axis is again in arbitrary units of overall circuit delay (inverse speed). The vertical axis is clock-tree delay in nanoseconds between receipt at input 114 and delivery to latches 740 of FIG. 7. The curve labeled C1 shows an overall clock-tree delay variation from 2 nsec at low overall delay (high circuit speed) to 8 nsec at high circuit delay (low circuit speed), a variation of 400%. This wastes 6 nsec of the total clock cycle in system 100; if the total is 50 nsec, this amounts to more than a 10% waste just to accommodate circuit speed differences in the system. The curve labeled COMP represents the delay added to the clock tree by delay unit 720. The vertical portions show where the PSE 300 switches the control bus 340 to decrease the number of active delay circuits. Curve C1' results from adding the delay of the COMP curve to that of the uncompensated clock C1. The compensated clock delay C1' varies between 8 nsec and 10 nsec, a variation of only 20%. This variation wastes only 2 nsec, or 4% of a 50 nsec total cycle time. Using more than five control lines in bus 340 would decrease wasted cycle time even further, if desired.

Figure 11:
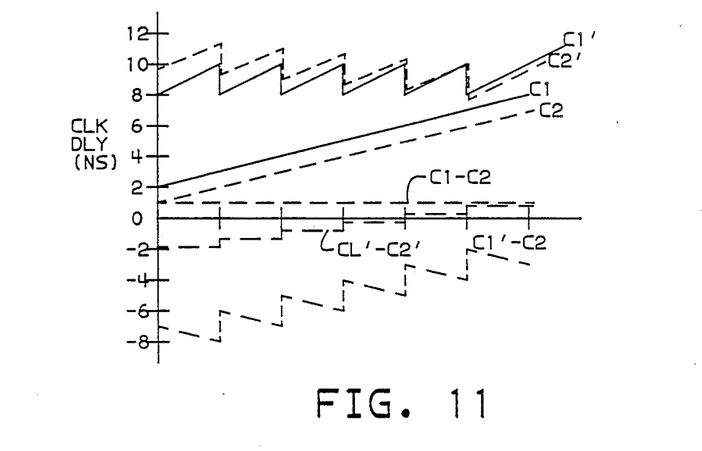
FIG. 11 shows delay compensation of multiple clock trees.

FIG. 11 shows the skew between clocks 113 and 114 within a single chip, both with and without compensation. The axes are the same as those of FIG. 10; and the curves C1 and C1' are repeated in FIG. 11.

The early-mode problem is depicted in curve C1–C2, the time difference between the falling edge of C1 and the rising edge of C2. Although these two signals track each other fairly well over variations in overall circuit speed, their differential delays through the clock trees 730 and 770 of FIG. 7 may produce an overlap, which in this example is a relatively constant overlap of 1 nsec in C1–C2. Moreover, even a slight mistracking might produce an even larger overlap at high circuit speed, where it is intolerable, than at low speeds, where is can be tolerated more easily by the increased delays between the chip circuits. Compensating the C1 clock only (that is, using connection 751' to bypass delay 760 in FIG. 7) removes the overlap entirely, and has its greatest effect at higher speeds, where it is even more desirable. The curve C1'–C2 shows compensation of C1 alone has produced a separation (negative overlap) of 7 nsec at high speed, dropping to 2 nsec at low speed.

In a multi-chip system, both the C1 and C2 clocks should be compensated for inter-chip (late-mode) skew. Such compensation can still alleviate the early-mode problem, by compensating the two signals at different rates. The dashed curve C2' shows the effect of compensation circuit 760, FIG. 7, on the raw C2 signal from input 113 to latches 740. Then, when the two differently compensated clocks are subtracted, curve C1'–C2'- shows that overlap does not occur over most of the speed range. Moreover, the compensation has been tailored so that where overlap does occur, it is at the slow end of the speed range where it is not harmful. In fact, it is beneficial for the overall system. Clock separation is wasted time in the overall clock cycle; its only purpose is to guarantee that the data signals do not propagate through latches 740 a cycle early. Since circuit 700 can be designed to allow a small overlap at low speeds, the clock separation at high speed is reduced, wasting less of the total cycle time in that region of the parameter space.

What is claimed is:

1. An integrated-circuit chip including a performance-sensing circuit for detecting the speed of other circuits on the same chip, comprising:
   means for receiving a pulse signal having a known interval;
   means for receiving a strobe clock signal having a known tie relation to said pulse signal;
   a cascade of circuit elements, coupled to said means for receiving a pulse, responsive to said pulse signal and having a plurality of taps between successive ones of said elements;
   storage means coupled to said plurality of taps and responsive to said strobe clock signal for storing and generating control signals indicating the position of said pulse signal in said cascade at the time of said strobe signal;
   control means, coupled to said storage means, for transmitting said control signals to said other circuits on said chip.

2. The chip of claim 1, wherein said storage means comprises a plurality of latches having
   data inputs connected to respective ones of said taps,
   clock inputs responsive to said strobe clock for latching said data inputs, and
   outputs for presenting said control signals on a plurality of separate lines of said control means.

3. The chip of claim 1, wherein said chip includes a plurality of peripheral input/output cells.

4. The chip of claim 3, wherein said performance sense circuit is located in at least one of said input/output cells.

5. The chip of claim 3, wherein said control means comprises a plurality of signal lines traversing said input/output cells.

6. The chip of claim 1, wherein each element of said cascade comprises a chain of individual circuits implemented in the same technology as said other circuits on said chip.

7. The chip of claim 6, wherein different ones of said cascade element contain different numbers of said individual circuits.

8. The chip of claim 1, wherein said performance-sensing circuit further includes clock generation means for receiving an external timing signal having a known frequency and for deriving therefrom both said pulse signal and said strobe clock.

9. The chip of claim 8, wherein said clock-generation means includes
   a counter having multiple stages and responsive to said external timing signal, and
   decoding means coupled to predetermined ones of said stages for producing said pulse signal and said strobe clock signal.

10. The chip of claim 9, wherein said strobe clock comprises a pair of signals, and wherein said pulse signal coincides with one of said pair of signals.

11. The chip of claim 1, wherein said performance-sensing circuit further includes test means coupled to said control lines and to said cascade for producing a predetermined test output signal when said performance-sensing circuit is operating properly.

12. The chip of claim 1, wherein one of said other circuits on said chip is a function circuit including
input means for receiving an input signal,
operating means for producing an output signal from said input signal, and
compensation means coupled to said control means for stabilizing an operational parameter of said function circuit in response to said control signals.

13. The chip of claim 12, wherein said function circuit is a driver circuit.

14. The chip of claim 13, wherein said operating means includes a predriver circuit and an output circuit coupled thereto, and wherein said compensation means includes means coupled to said predriver circuit and responsive to said control signal for stabilizing a rate of change of voltage in said predriver circuit.

15. The chip of claim 13, wherein said control means includes a plurality of different control lines for carrying said control signal, wherein said predriver circuit includes a series string of transistors controlled by said input signal, and wherein said compensation means comprises a plurality of parallel transistors connected in series with said series string, each of said parallel transistors being controlled by a different one of said control lines.

16. The chip of claim 13, wherein said compensation means includes means coupled to said operating means and responsive to said control signal for stabilizing a rate of change of current of said output signal.

17. The chip of claim 13, wherein said control means includes a plurality of control lines for carrying said control signal, wherein said output means includes a plurality of transistors in parallel, and wherein said compensation means includes a plurality of transistors respectively in series with at least some of said output-means transistors and coupled to respective ones of said control-signal lines.

18. The chip of claim 13, wherein said output signal is directly coupled to an external pin of said chip.

19. The chip of claim 12, wherein said compensation means includes delay means coupled to said input means and to said output means for selectively delaying said input signal.

20. The chip of claim 19, wherein said delay means is adapted to achieve a substantially constant absolute time delay of said input signal through said function circuit.

21. The chip of claim 19, wherein said delay means is coupled for achieving a time delay of said input signal through said function circuit, said time delay varying at a different rate from that of another circuit on the same chip.

22. An electronic system including a clock-signal generator for producing at least one clock signal, multiple integrated-circuit chips, and means for distributing said clock signal to a plurality of said chips, comprising the combination physically located on each of said plurality of chips:
an open loop performance-sensing circuit for detecting the operational speed of other circuits on the same chip and for producing a control signal indicative of said speed;
a network of on-chip function circuits;
receiver means having an input for receiving said clock signal onto said chip,
delay means coupled to said receiver for selectively delaying said clock signal in response to various states of said control signal,
buffer means coupled to said delay means for distributing said clock signal to multiple ones of said function circuits on said chip.

23. The system of claim 22, wherein said delay means comprises
a cascade of delay elements having an input coupled to said receiver means and having a plurality of taps between said elements;
output means coupled to said buffer means;
a plurality of switches coupled between said taps and said output means, said switches being responsive to said control signal for selectively coupling different ones of said taps to said output means.

24. The system of claim 23, wherein said performance-sensing circuit includes a plurality of separate control lines for carrying different portions of said control signal, and wherein said switches are coupled to different ones of said control lines.

25. The system of claim 23, wherein said delay elements each comprise at least one logic circuit.

26. The system of claim 25, wherein different ones of said delay elements comprise different numbers of said logic circuits.

27. The system of claim 23, wherein said delay means is adapted to impose a predetermined relation between said circuit speed and the time interval of said clock signal between said receiver input and said network of function circuits.

28. The system of claim 27, wherein said time interval is substantially constant.

29. The system of claim 27, wherein said relation is a decreasing time interval for a decreasing circuit speed.

30. The system of claim 23, wherein said clock-signal generator produces a second clock signal, and further comprising, on each of said plurality of chips:
second receiver means having a second input for receiving said second clock signal onto said chip; and
buffer means coupled to said delay means for distributing said second clock signal to at least some of said multiple function circuits on said chip.

31. The system of claim 30, wherein said second receiver means is connected directly to said second buffer means, such that the time interval of said second clock between said second input and said function circuits varies with the speed of said chip circuits.

32. The system of claim 30, further comprising second delay means coupled to said second receiver for selectively delaying said second clock signal in response to various states of said control signal.

33. An integrated-circuit chip, comprising:
a performance-sensing circuit, coupled to delay means for detecting the operational speed of other circuits on the same chip and for producing a control signal indicative of said speed;
receiver means for receiving an input signal;
function means coupled to said receiver means for manipulating said input signal and producing an output signal therefrom; and
delay means coupled between said receiver means and said function means for selectively delaying said input signal in response to said control signal so as to achieve a predetermined relationship between said operational speed and the delay of said input signal between said receiver and said function means.

34. The chip of claim 33, wherein said delay means is responsive to said control signal so as to delay said input signal less as said operational speed decreases so as to maintain a substantially constant time interval between said input and said output signals.

35. The chip of claim 33, further comprising
second receiver means for receiving a second input signal, and
second function means coupled to said second receiver means for manipulating said second input signal and producing a second output signal therefrom; and
wherein said delay means is responsive to said control signal so as to delay said second input signal so as to maintain a predetermined relationship between said first input signal and said second input signal.

36. The chip of claim 35, wherein said predetermined relationship is a separation or non-overlap between said input signal and said second input signal.

37. The chip of claim 35, wherein said input signal and said second input signal are non-overlapping clock signals.

38. A method of detecting the speed of operating circuits on an integrated-circuit chip, comprising
producing a pulse signal having first and second signal edges separated by a known time interval;
producing a strobe clock signal having a predetermined time relationship to at least one of said signal edges;
transmitting said pulse signal through a cascade of circuit elements on said chip;
at a time thereafter predetermined by said strobe signal, detecting the states, determined by the presence of said pulse signal, of a number of individual ones of said circuit elements in said cascade;
producing from said circuit-element states a control signal indicating the speed of said operating circuits on said chip.

39. The method of claim 38, wherein said first and second signal edges of said pulse signal are rising and falling edges of a pulse having a known time duration.

40. The method of claim 38, wherein said strobe clock has a feature coinciding with the second signal edge of said pulse signal.

41. The method of claim 38, wherein the step of producing said control signal comprises
storing the states of said circuit elements, and
transmitting said stored states to predetermined ones of said operating circuits.

42. A method of controlling the time interval between a first input signal and an output signal on a semiconductor chip having multiple logic circuits, comprising:
receiving said first input signal;
sensing the operational speed of said logic circuits on said chip, utilizing a performance-sensing circuit that is decoupled from said logic circuits;
producing a control signal representing said operational speed;
delaying said input signal on said chip by one of a number of different time increments in response to said control signal; and
transmitting said delayed input signal to said output.

43. The method of claim 42, wherein said different time increments are selected so as to stabilize the total time delay between said first input signal and said output signal toward a constant value, independent of variations in said operational speed.

44. The method of claim 42, further comprising the step of receiving a second input signal, and wherein said different time increments are selected so as to produce a predetermined relationship between said first and second input signals.

45. The method of claim 44, wherein said first and said second signals have nonoverlapping pulses, and wherein said time increments are selected so as to prevent overlap between said output signal and said second input signal.

46. The method of claim 44, wherein said first and said second signals have nonoverlapping pulses, and wherein said time increments are selected so as to prevent overlap between said output signal and said second input signal over only a portion of the range of said operational speed.

* * * * *